United States Patent
Yu et al.

(10) Patent No.: US 12,283,785 B2
(45) Date of Patent: Apr. 22, 2025

(54) JIG FOR ASSISTING PLUGGABLE CONNECTOR AND PLUGGABLE MECHANISM WITH SYNCHRONOUS CONNECTING ROD THEREOF

(71) Applicant: Inspur Suzhou Intelligent Technology Co., Ltd., Suzhou (CN)

(72) Inventors: Shimao Yu, Suzhou (CN); Jie Yang, Suzhou (CN); Xiuzhong Yin, Suzhou (CN); Hailong Zhang, Suzhou (CN)

(73) Assignee: Inspur Suzhou Intelligent Technology Co., Ltd., Suzhou (CN)

( * ) Notice: Subject to any disclaimer, the term of this patent is extended or adjusted under 35 U.S.C. 154(b) by 341 days.

(21) Appl. No.: 17/917,744

(22) PCT Filed: Sep. 23, 2020

(86) PCT No.: PCT/CN2020/117028
§ 371 (c)(1),
(2) Date: Oct. 7, 2022

(87) PCT Pub. No.: WO2021/203631
PCT Pub. Date: Oct. 14, 2021

(65) Prior Publication Data
US 2023/0163548 A1 May 25, 2023

(30) Foreign Application Priority Data
Apr. 8, 2020 (CN) .......................... 202010269728.X (51) Int. Cl.
*H01R 43/26* (2006.01)
(52) U.S. Cl.
CPC .................... *H01R 43/26* (2013.01)
(58) Field of Classification Search
CPC ........ H01R 13/62944; H01R 13/62938; H01R 43/26
(Continued)

(56) References Cited

U.S. PATENT DOCUMENTS 5,873,745 A * 2/1999 Duclos ............. H01R 13/62944
439/372
6,824,406 B1 * 11/2004 Sharples .......... H01R 13/62977
439/157
(Continued)

FOREIGN PATENT DOCUMENTS

CN 202517425 11/2012
CN 202817379 3/2013
(Continued)

OTHER PUBLICATIONS

International Search Report and Written Opinion of corresponding PCT Application No. PCT/CN2020/117028 dated Jan. 12, 2021 including English Translation (15 pages).
(Continued)

*Primary Examiner* — Gary F Paumen
(74) *Attorney, Agent, or Firm* — Crowell & Moring LLP (57) ABSTRACT

A pluggable mechanism with a synchronous connecting rod includes a turnover connecting rod reversibly disposed on a surface of a jig housing, a synchronous connecting rod fixedly connected to a rod body of the turnover connecting rod, and a plurality of clamping claws connected to the synchronous connecting rod and configured to clamp corresponding connectors respectively to rotate and apply forces for plugging and unplugging. A clamping groove configured to clamp the connector is disposed in an outer edge of each clamping claw, and a rotation center hole configured to cooperate with a centering pin shaft reserved on the jig housing is disposed in a surface of each clamping claw.

20 Claims, 5 Drawing Sheets (58) Field of Classification Search
USPC .................................... 439/157, 160, 153
See application file for complete search history.

(56) References Cited

U.S. PATENT DOCUMENTS

| | | | | |
|---|---|---|---|---|
| 8,435,057 | B1* | 5/2013 | Jun ................. | H05K 7/1409 439/157 |
| 9,015,931 | B2* | 4/2015 | Boetzer ........... | H01R 13/62905 361/679.01 |
| 2004/0242039 | A1* | 12/2004 | Griffin ............. | H05K 7/1409 439/157 |
| 2010/0226716 | A1* | 9/2010 | Imai ................ | H01R 13/62944 403/361 |
| 2012/0108093 | A1* | 5/2012 | Sato ................ | H01R 13/62994 439/160 |
| 2016/0108940 | A1* | 4/2016 | Kritter ............ | H01R 13/62938 403/409.1 |

FOREIGN PATENT DOCUMENTS

| | | |
|---|---|---|
| CN | 204732657 | 10/2015 |
| CN | 205265022 | 5/2016 |
| CN | 107046212 | 8/2017 |
| CN | 206546400 | 10/2017 |
| CN | 207509119 | 6/2018 |
| CN | 207947440 | 10/2018 |
| CN | 109327992 | 2/2019 |
| CN | 208979841 | 6/2019 |
| CN | 209472172 | 10/2019 |
| CN | 209844194 | 12/2019 |
| CN | 111478148 | 7/2020 |
| JP | 08162207 | 6/1996 |
| JP | 2002270295 | 9/2002 |

OTHER PUBLICATIONS

"Search report of corresponding CN priority application (CN202010269728.X) Jan. 29, 2021" (2 pages).

"First Office Action of corresponding CN priority application (CN202010269728.X) Feb. 3, 2021", including English translation (9 pages).

"Notification to Grant Patent Right for Invention of corresponding CN priority application (CN202010269728.X) Jun. 11, 2021", including English translation (2 pages).

* cited by examiner

JIG FOR ASSISTING PLUGGABLE CONNECTOR AND PLUGGABLE MECHANISM WITH SYNCHRONOUS CONNECTING ROD THEREOF

This application is the national phase application of International Application No. PCT/CN2020/117028, filed Sep. 23, 2020, which claims priority to Chinese Patent Application No. 202010269728.X, filed on Apr. 8, 2020, in China National Intellectual Property Administration and entitled "Jig for Assisting Pluggable Connector and Pluggable Mechanism with Synchronous Connecting Rod Thereof", the contents of each of which are hereby incorporated by reference in their entirety.

FIELD

The present disclosure relates to a technical field of servers, and particularly to a pluggable mechanism with a synchronous connecting rod. The present disclosure also relates to a jig for assisting a pluggable connector.

BACKGROUND

In China, with a development of electronic technology, more and more electronic devices have been used extensively.

As an important part of an electronic device, a server is a device that provides computing service. The server needs to respond to and process service requests, and thus generally needs to be able to undertake and guarantee service. According to different types of service provided by the server, the server is divided into a file server, a database server, an application server, a WEB server, etc. Like a general-purpose component architecture, the server mainly includes a processor, a hard disk, a memory, a system bus, etc. However, the server needs to provide high-reliability service, and thus is required to be relatively high in processing capability, stability, reliability, safety, extensibility, manageability, etc.

In an era of big data, a large number of Internet Technology (IT) devices may be concentrated in data centers. These data centers include various servers, memories, switches, and a large number of cabinets and other infrastructures. Each IT device includes various hardware boards, such as a computing module, a storage module, a case, and a fan module.

Currently, a server market is growing larger, and the server platform architecture is also getting bigger. To improve an efficiency and performance of servers, major manufacturers continuously launch efficient high-speed signal connectors, generally including a Peripheral Component Interface Express (PCIE), a Serial Advanced Technology Attachment (SATA), a Serial Attached Small Computer System Interface (SAS), a Local Area Network (LAN), etc.

A high-speed signal connector is high in pin density, relatively strong in plugging strength, and tight in connection, and thus signals are transmitted stably. However, it is not conducive to plugging and unplugging operations. Currently, the high-speed signal connector is usually plugged and unplugged manually, but this manner is laborious and inefficient. As an improvement, there are structures in the prior art that implement labor-saving operations by use of a lever principle. However, the plugging and unplugging operations may be performed on only one connector at one time, and operation efficiency is too low. And because a distribution of the high-speed signal connectors is large and distribution positions are different, a labor amount is still large, and time cost is relatively high.

Therefore, how to implement the plugging and unplugging operations of multiple connectors at the same time to reduce the labor amount and labor cost and improve the operation efficiency is a technical problem faced by those skilled in the art.

SUMMARY

An objective of the present disclosure is to provide a pluggable mechanism with a synchronous connecting rod, which may implement plugging and unplugging operations on multiple connectors at the same time to reduce a labor intensity and a labor cost and improve operation efficiency. A further objective of the present disclosure is to provide a jig for assisting a pluggable connector.

In order to solve the foregoing technical problem, the present disclosure provides the pluggable mechanism with the synchronous connecting rod, including a turnover connecting rod reversibly disposed on a surface of a jig housing, a synchronous connecting rod fixedly connected to a rod body of the turnover connecting rod, and a plurality of clamping claws connected to the synchronous connecting rod and configured to clamp corresponding connectors respectively to rotate and apply forces for plugging and unplugging. A clamping groove configured to clamp the connector is disposed in an outer edge of each clamping claw, and a rotation center hole configured to cooperate with a centering pin shaft reserved on the jig housing is disposed in a surface of each clamping claw.

In some embodiments, there are two turnover connecting rods are simultaneously distributed on the jig housing and located on outer walls of both sides of the jig housing respectively.

In some embodiments, a connecting beam that facilitates manual force application for simultaneous operation is connected between front ends of the turnover connecting rods at both sides.

In some embodiments, a tail end of the turnover connecting rod is fixedly connected to a middle or two ends of the synchronous connecting rod.

In some embodiments, an end portion of each clamping claw is detachably connected with the synchronous connecting rod through a fastener.

In some embodiments, the synchronous connecting rod is a groove-shaped part, and the end portion of each clamping claw is inserted into a groove of the synchronous connecting rod, and is clamped by groove walls of both sides through the fastener.

In some embodiments, the mechanism further includes an auxiliary connecting rod component connected between the plurality of clamping claws and configured to transmit an acting force between the plurality of clamping claws to improve the motion synchrony of the plurality of clamping claws.

In some embodiments, the auxiliary connecting rod component includes a first auxiliary connecting rod disposed against the surface of each clamping claw, and a first rotating shaft in running fit with a first through hole disposed in the surface of each clamping claw is disposed on a surface of the first auxiliary connecting rod.

In some embodiments, a first cambered hole configured to avoid the centering pin shaft during rotation is disposed in the surface of the first auxiliary connecting rod.

In some embodiments, the auxiliary connecting rod component further includes a second auxiliary connecting rod disposed against the surface of the first auxiliary connecting rod, a second rotating shaft in running fit with a second through hole disposed in the surface of each clamping claw is erected on a surface of the second auxiliary connecting rod, and the first through hole and the second through hole are disposed in both sides of the rotation center hole respectively.

In some embodiments, a second cambered hole configured to avoid the centering pin shaft during rotation is disposed in the surface of the second auxiliary connecting rod.

The present disclosure also provides a jig for assisting a pluggable connector, including a jig housing detachably mounted to a server chassis and the pluggable mechanism with the synchronous connecting rod disposed on the jig housing. The pluggable mechanism with the synchronous connecting rod is the pluggable mechanism with the synchronous connecting rod as described above.

In some embodiments, a plurality of positioning columns configured to fit respective insertion holes disposed in the server chassis and identify mounting positions of the jig housing are erected on an inner surface of the jig housing.

In some embodiments, a plurality of elastic columns configured to abut with a surface of the server chassis and increase a mounting pre-tightening force between the jig housing and the server chassis are further disposed on the inner surface of the jig housing.

In some embodiments, a handle groove convenient to grab with a hand to apply a force to push and pull the jig housing is disposed in an outer surface of the jig housing.

The pluggable mechanism with the synchronous connecting rod provided in the present disclosure mainly includes a turnover connecting rod, a synchronous connecting rod, and multiple clamping claws. The turnover connecting rod is disposed on a surface of a jig housing, and may perform a turnover motion on the jig housing. The synchronous connecting rod is fixedly connected to a rod body of the turnover connecting rod, and rotates synchronously with the turnover motion of the turnover connecting rod. All of the multiple clamping claws are connected to the synchronous connecting rod and driven by the synchronous connecting rod to perform a synchronous rotational motion. A clamping groove is disposed in an outer edge of each clamping claw such that connectors are clamped by the clamping grooves, and forces are applied to drive the connectors to perform turnover motions to further unplug the connectors that are plugged in each other or plug adapted connectors into each other. In addition, a rotation center hole is disposed in a surface of each clamping claw. The rotation center hole fits a centering pin shaft reserved on the jig housing, so as to position and mount each clamping claw on the jig housing. More importantly, due to the fit of the rotation center hole and the centering pin shaft, when the turnover connecting rod performs a turnover motion, the synchronous connecting rod may simultaneously drive each clamping claw to perform a synchronous rotational motion with a respective rotation center hole as a rotation axis, to enable the clamping claws to synchronously complete the plugging and unplugging operations of the respective corresponding connectors. In summary, when performing the plugging and unplugging operations on connectors by use of the pluggable mechanism with the synchronous connecting rod of the jig for assisting the pluggable connector provided in the present disclosure, an operator may align the clamping groove of each clamping claw with each connector first for clamping, and then apply a force to the turnover connecting rod to pull the turnover connecting rod to a preset rotation direction, such that the synchronous connecting rod rotates synchronously with the turnover connecting rod, and then each clamping claw is further driven to rotate around a respective rotation center hole to gradually complete the plugging or unplugging operations of the adapted connectors during rotation. Compared with the prior art, the present disclosure has the advantage that the plugging and unplugging operations of multiple connectors may be implemented at the same time to reduce the labor intensity and the labor cost and improve the operation efficiency.

BRIEF DESCRIPTION OF THE DRAWINGS

In order to describe technical solutions in embodiments of the present disclosure or the prior art more clearly, drawings required to be used in descriptions about the embodiments or the prior art will be introduced briefly below. Apparently, the drawings in the description below are merely embodiments of the present disclosure. Those ordinarily skilled in the art may further obtain other drawings according to provided drawings without creative work.

In FIGS. 1 to 5:

jig housing—1, turnover connecting rod—2, synchronous connecting rod—3, clamping claw—4, connecting beam—5, fastener—6, first auxiliary connecting rod—7, second auxiliary connecting rod—8, positioning column—9, elastic column—10, and handle groove—11; and clamping groove—401, rotation center hole—402, first through hole—403, second through hole—404, first rotating shaft—701, first cambered hole—702, second rotating shaft—801, and second cambered hole—802.

DETAILED DESCRIPTION

The technical solutions in the embodiments of the present disclosure will be described clearly and completely below in combination with the drawings in the embodiments of the present disclosure. Clearly, the described embodiments are not all but only part of embodiments of the present disclosure. All other embodiments obtained by those ordinarily skilled in the art based on the embodiments in the present disclosure without creative work shall fall within the scope of protection of the present disclosure.

Figure 1:
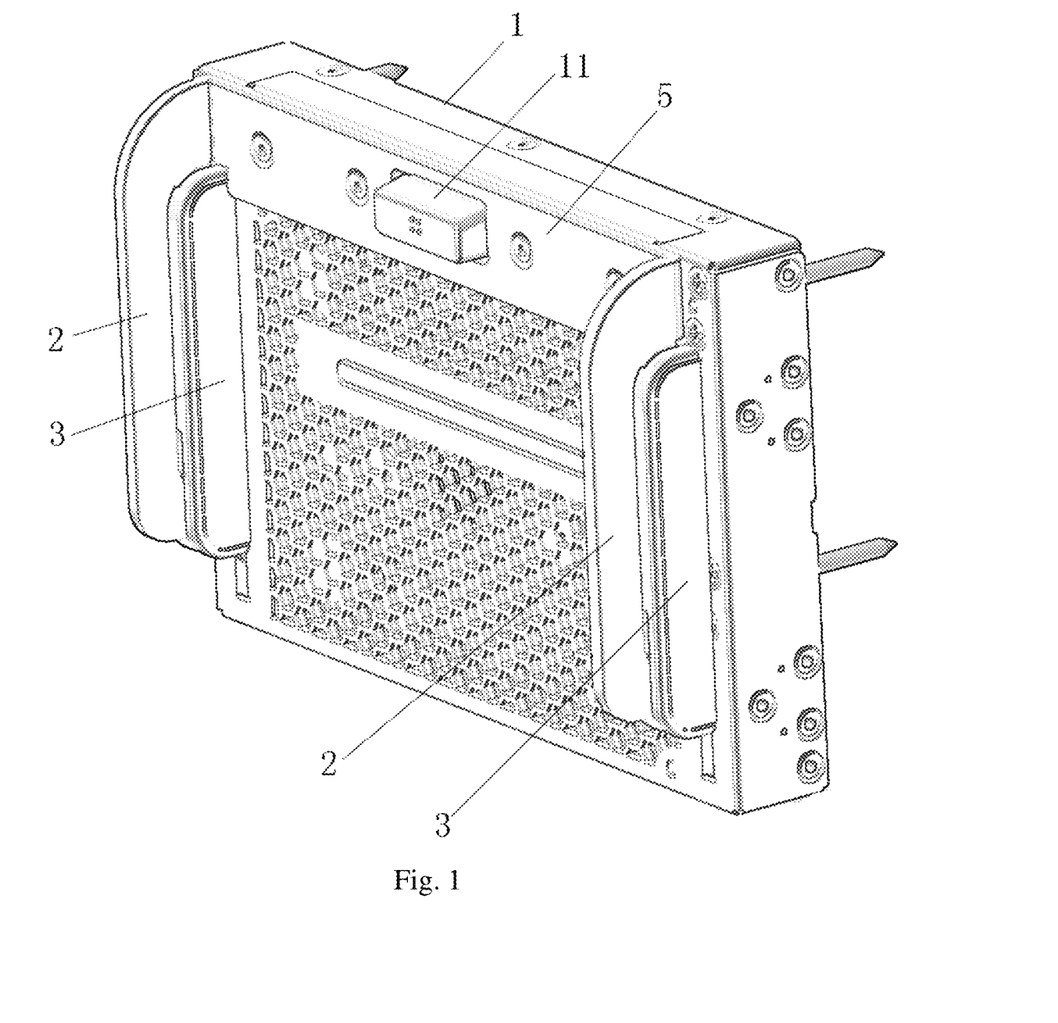
FIG. 1 is an overall schematic structural diagram of an implementation mode according to the present disclosure.

Referring to FIG. 1, FIG. 1 is an overall schematic structural diagram of an implementation mode of a jig according to the present disclosure.

In an implementation mode provided in the present disclosure, a pluggable mechanism with a synchronous connecting rod mainly includes a turnover connecting rod 2, a synchronous connecting rod 3, and clamping claws 4.

The turnover connecting rod 2 is disposed on a surface of a jig housing 1, and may turn over the jig housing 1. The synchronous connecting rod 3 is fixedly connected to a rod body of the turnover connecting rod 2, and rotates synchronously with a turnover motion of the turnover connecting rod 2.

All of the clamping claws 4 are connected to the synchronous connecting rod 3 and driven by the synchronous connecting rod 3 to perform a synchronous rotational motion. A clamping groove 401 is disposed in an outer edge of each clamping claw 4 such that connectors are clamped by the clamping grooves 401, and forces are applied to drive the connectors to perform turnover motions to further unplug the connectors plugged-in or plug adapted connectors in.

In addition, a rotation center hole 402 is disposed in a surface of each clamping claw 4. The rotation center hole 402 fits a centering pin shaft reserved on the jig housing 1, so as to position and mount each clamping claw 4 on the jig housing 1. More importantly, due to the fit of the rotation center hole 402 and the centering pin shaft, when the turnover connecting rod 2 performs a turnover motion, the synchronous connecting rod 3 may simultaneously drive each clamping claw 4 to perform a synchronous rotational motion with a respective rotation center hole 402 as a rotation axis, to enable each clamping claw 4 to synchronously complete a plugging and unplugging operation of a respective corresponding connector.

In summary, when performing the plugging and unplugging operation on connector by use of the pluggable mechanism with the synchronous connecting rod of a jig for assisting a pluggable connector provided in the present disclosure, an operator may align and clamp the clamping groove 401 of each clamping claw 4 with each connector first, and then apply a force to the turnover connecting rod 2 to pull the turnover connecting rod 2 to a preset rotation direction, such that the synchronous connecting rod 3 rotates synchronously with the turnover connecting rod 2, and then each clamping claw 4 is further driven to rotate around the respective rotation center hole 402 to gradually complete the plugging or unplugging operation of the adapted connector during rotation. Compared with the prior art, the present disclosure has an advantage that plugging and unplugging operations of multiple connectors may be implemented at the same time to reduce a labor intensity and a labor cost and improve operation efficiency.

In general, in the present disclosure, there are two turnover connecting rods 2 distributed on the jig housing 1, which are located on outer walls of both sides of the jig housing 1 respectively. In this way, the turnover connecting rod 2 may be operated to complete the plugging and unplugging operations of the connectors distributed at both sides of the jig housing 1 at the same time, which is mainly applied to two connectors at different positions on a single server mainboard in practice.

Further, in order to facilitate a one-handed pulling operation of an operator on the turnover connecting rods 2 at both sides, in the present disclosure, a connecting beam 5 is additionally disposed between front ends of the turnover connecting rods 2 at both sides. In some embodiments, the turnover connecting rod 2 is generally vertically mounted on the jig housing 1 when not turning over, with front end at a top while a tail end at a bottom. Then, two ends of the connecting beam 5 are horizontally disposed at a top surface of the jig housing 1 and connected with the tops of the turnover connecting rods 2 at both sides respectively. In this way, the operator only needs to pull a middle of the connecting beam 5 with one hand to simultaneously pull the turnover connecting rods 2 at both sides to rotate.

Figure 2:
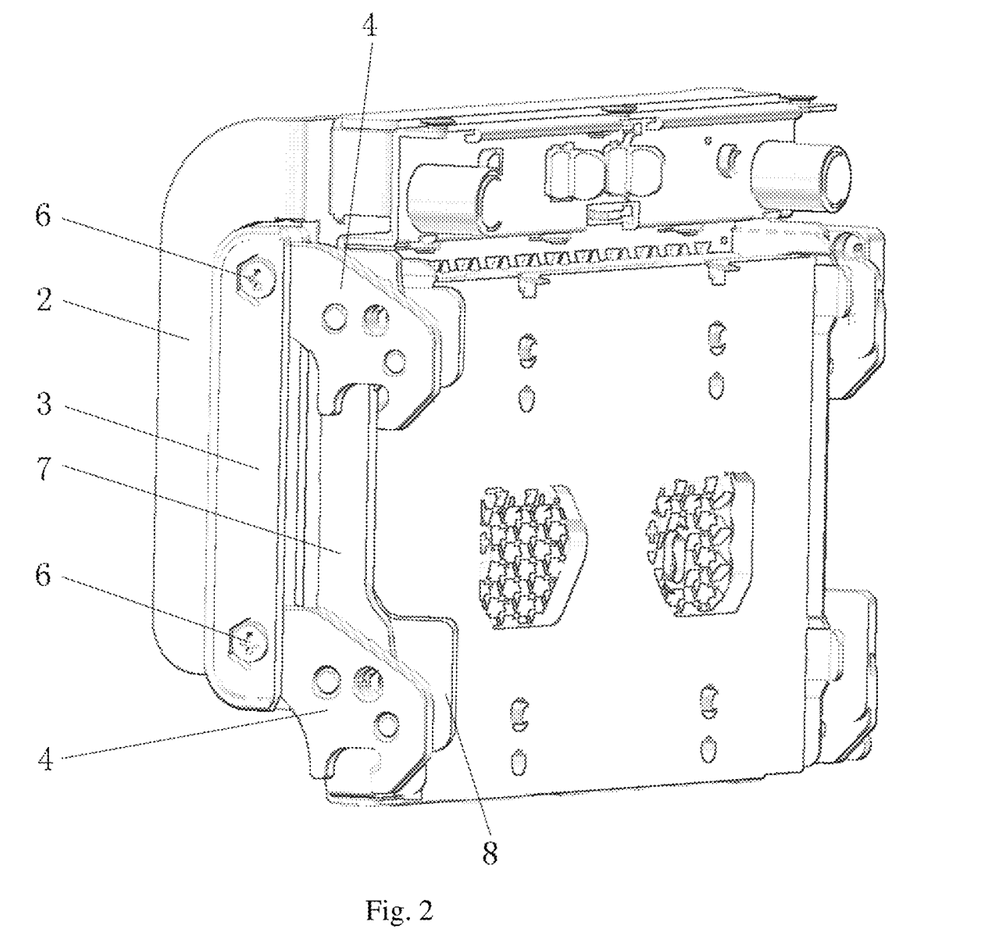
FIG. 2 is a partial schematic structural diagram of FIG. 1.

As shown in FIG. 2, FIG. 2 is a partial schematic structural diagram of FIG. 1.

In order to enable the turnover connecting rod 2 to conveniently drive the synchronous connecting rod 3 to perform a synchronous rotational motion, in the present disclosure, a tail end of the turnover connecting rod 2 may be fixedly connected to a middle or two ends of the synchronous connecting rod 3. In some embodiments, the synchronous connecting rod 3 is generally vertical when not rotating, like the turnover connecting rod 2. Therefore, a bottom end of the synchronous connecting rod 3 may be fixed to a bottom of the turnover connecting rod 2. Certainly, a connection position of the turnover connecting rod 2 and the synchronous connecting rod 3 is not fixed, and may be selected as needed.

In addition, considering that there are many types of connectors, in order to improve a adaptability of this mechanism to the connectors of different types and different sizes, in the present disclosure, an end portion of each clamping claw 4 may be detachably connected with the synchronous connecting rod 3 through a fastener 6. In this way, the fastener 6 may be turned to conveniently implement assembling and disassembling operations of each clamping claw 4 and the synchronous connecting rod 3, so as to facilitate maintenance and replacement.

Figure 3:
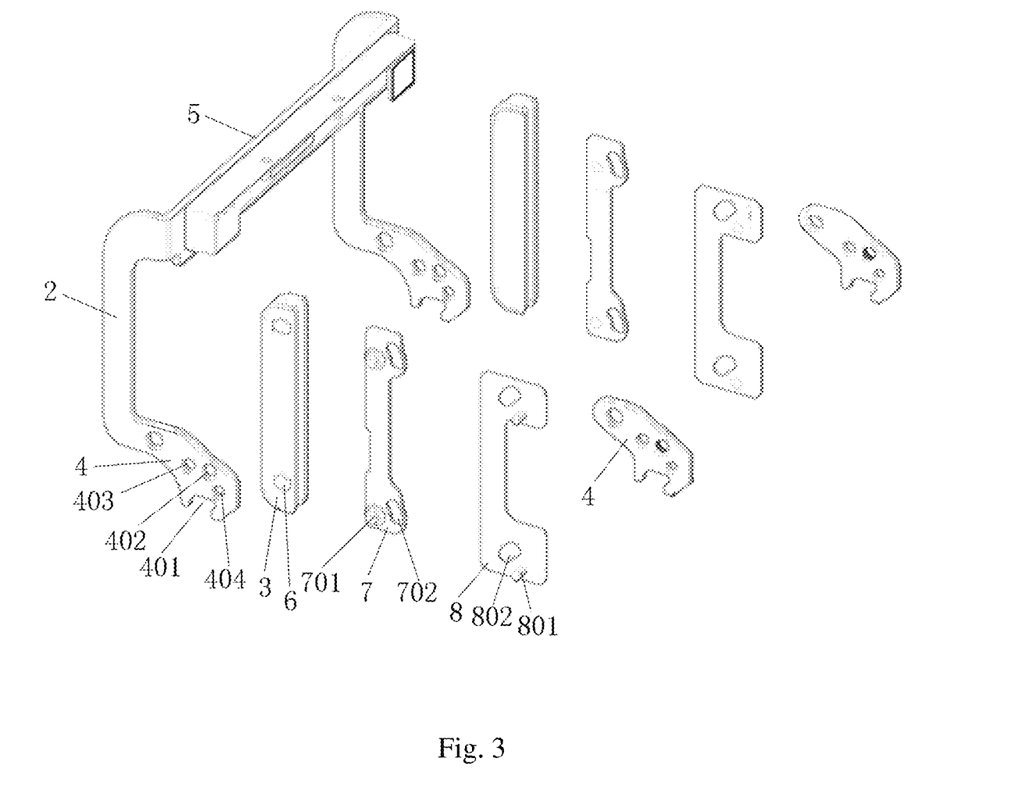
FIG. 3 is an exploded structural view of a pluggable mechanism with a synchronous connecting rod shown in FIG. 2.

As shown in FIG. 3, FIG. 3 is an exploded structural view of a pluggable mechanism with a synchronous connecting rod shown in FIG. 2.

In some implementation modes of the synchronous connecting rod 3, the synchronous connecting rod 3 may be a long-strip groove-shaped part whose cross section is shaped into U with a groove. In this way, the end portion of each clamping claw 4 may be inserted into the groove of the synchronous connecting rod 3, and the end portion of each clamping claw 4 is clamped by groove walls of both sides of the synchronous connecting rod 3. At the same time, the end portion of each clamping claw 4 is fixed by the fastener 6 inserted into the synchronous connecting rod 3. Certainly, to facilitate connection between the synchronous connecting rod 3 and the tail end of the turnover connecting rod 2, a mounting hole may be disposed in the tail end of the turnover connecting rod 2 for the fastener 6 to pass through, to tighten and fix the synchronous connecting rod 3, the tail end of the turnover connecting rod 2, and the end portion of the clamping claw 4.

At the same time, considering that the synchronous connecting rod 3 is long-strip, the clamping claws 4 may be distributed on the synchronous connecting rod 3 along a length direction of the synchronous connecting rod 3. For example, two to four clamping claws may be simultaneously disposed. Moreover, the clamping claws 4 are generally vertical in a natural state, like the synchronous connecting rod 3, and thus are hierarchically distributed in a vertical direction to be adapted to plugging and unplugging of connects on different server nodes. For ease of description, the following descriptions of the present disclosure are made taking the respective arrangement of two clamping claws 4 (a bottom clamping claw 4 and a top clamping claw 4 respectively) at the two ends of the synchronous connecting rod 3 as an example.

In some implementation modes provided in the present disclosure, to improve the synchrony of the clamping claws 4 during the rotational motion, an auxiliary connecting rod component is additionally disposed in the present disclosure. The whole auxiliary connecting rod component is connected between the clamping claws 4 mainly to transmit interacting forces generated by the clamping claws 4 during the rotational motion to improve the motion synchrony of the clamping claws 4.

Figure 4:
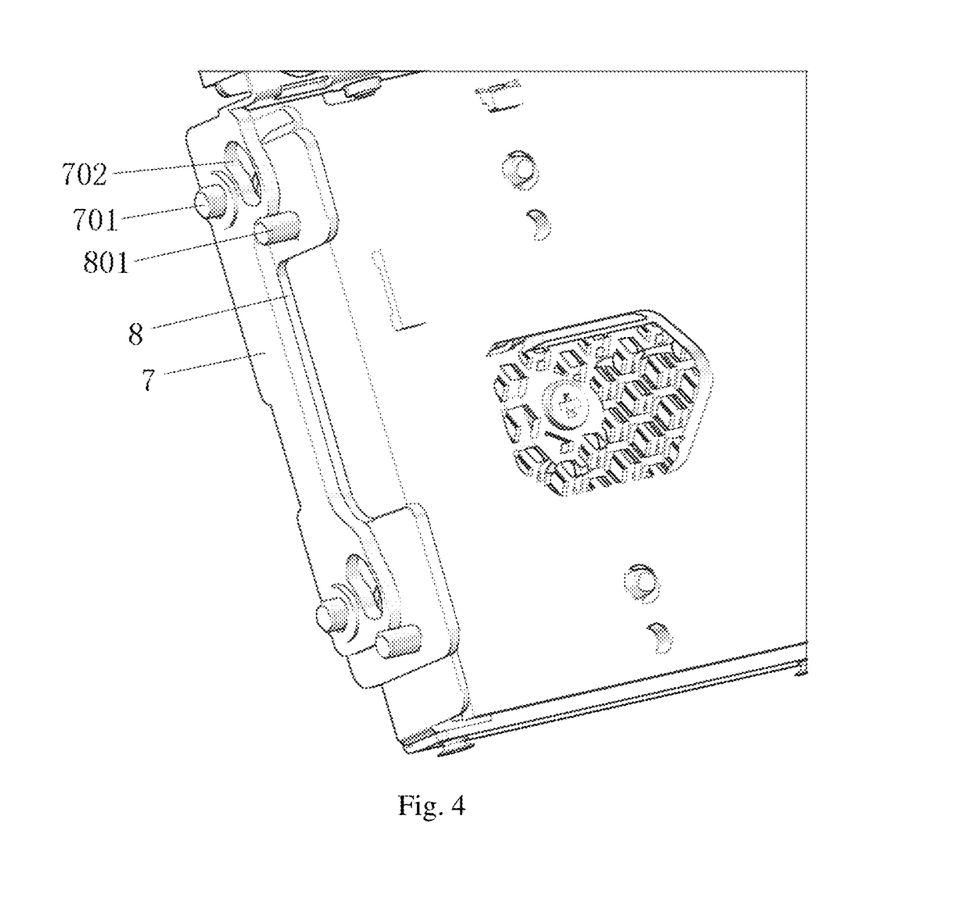
FIG. 4 is a structural assembly diagram of a first auxiliary connecting rod and a second auxiliary connecting rod shown in FIG. 2.

In some embodiments, the auxiliary connecting rod component mainly includes a first auxiliary connecting rod 7 and a second auxiliary connecting rod 8. As shown in FIG. 4, FIG. 4 is a structural assembly diagram of the first auxiliary connecting rod 7 and second auxiliary connecting rod 8 shown in FIG. 2.

The first auxiliary connecting rod 7 is disposed against a surface of each clamping claw 4 (without hindering normal rotation of each clamping claw 4). In addition, a first rotating shaft 701 is erected on a surface of the first auxiliary connecting rod 7. In general, the first rotating shaft 701 may be disposed at a bottom of the first auxiliary connecting rod 7, and is mainly configured to form a running fit with a first through hole 403 disposed in the surface of the clamping claw 4. In this way, the bottom clamping claw 4 is connected with the top clamping claw 4 through not only the synchronous connecting rod 3 but also the first auxiliary connecting rod 7, such that an acting force between the two clamping claws is transmitted by the first auxiliary connecting rod 7 during their synchronous rotational motion, improving the motion synchrony therebetween.

Based on the same consideration, in the present disclosure, the second auxiliary connecting rod 8 is disposed against the surface of the first auxiliary connecting rod 7. In addition, a second rotating shaft 801 is erected on a surface of the second auxiliary connecting rod 8. In general, the second rotating shaft 801 may be disposed at a bottom of the second auxiliary connecting rod 8, and is mainly configured to form a running fit with a second through hole 404 disposed in the surface of the clamping claw 4. In this way, the bottom clamping claw 4 is connected with the top clamping claw 4 through not only the synchronous connecting rod 3 and the first auxiliary connecting rod 7 but also the second auxiliary connecting rod 8, such that an acting force between the two clamping claws is transmitted by the second auxiliary connecting rod 8 during their synchronous rotational motion, improving the motion synchrony therebetween.

In addition, to avoid structural repetitions, in the present disclosure, a connection position of the first auxiliary connecting rod 7 and each clamping claw 4 is different from that of the second auxiliary connecting rod 8 and each clamping claw 4. In some embodiments, since the first auxiliary connecting rod 7 is connected with the first through hole 403 through the first rotating shaft 701, and the second auxiliary connecting rod 8 is connected with the second through hole 404 through the second rotating shaft 801, in the present disclosure, the first through hole 403 and the second through hole 404 are disposed in both sides of the rotation center hole 402 respectively. In this way, when the turnover connecting rod 2 performs a turnover motion, the synchronous connecting rod 3 is driven first to rotate synchronously (translationally downwards), and then each clamping claw 4 is driven by the rotation of the synchronous connecting rod 3 to rotate. In this process, the first rotating shaft 701 on the first auxiliary connecting rod 7 presses the first through hole 403 down, and meanwhile, the second rotating shaft 801 on the second auxiliary connecting rod 8 lifts the second through hole 404 up. Under two effects, there is generated a rotational moment for counterclockwise rotation of the clamping claw 4 as shown in the figure, to assist each clamping claw 4 in the rotational motion. Therefore, the mechanism is more labor-saving for the operator, and mechanical efficiency and transmission efficiency is improved.

Further, the centering pin shaft of the jig housing 1 is inserted into the rotation center hole 402 of each clamping claw 4, and the first auxiliary connecting rod 7 and the second auxiliary connecting rod 8 are disposed close to the centering pin shaft. In consideration of this, to avoid motion interference, in the present disclosure, a first cambered hole 702 is disposed in the surface of the first auxiliary connecting rod 7, and a second cambered hole 802 is disposed in the surface of the second auxiliary connecting rod 8. In this way, formation of the first cambered hole 702 and the second cambered hole 802 enables each clamping claw 4 to provide during the rotational motion a motion guide path and a motion space for rotation of the first auxiliary connecting rod 7 and the second auxiliary connecting rod 8 relative to the centering pin shaft.

The present disclosure also provides a jig for assisting a pluggable connector, mainly including a jig housing 1 detachably mounted to a server chassis and the pluggable mechanism with the synchronous connecting rod disposed on the jig housing 1. Contents about the pluggable mechanism with the synchronous connecting rod are the same as the above-mentioned related contents, and will not be elaborated herein.

Figure 5:
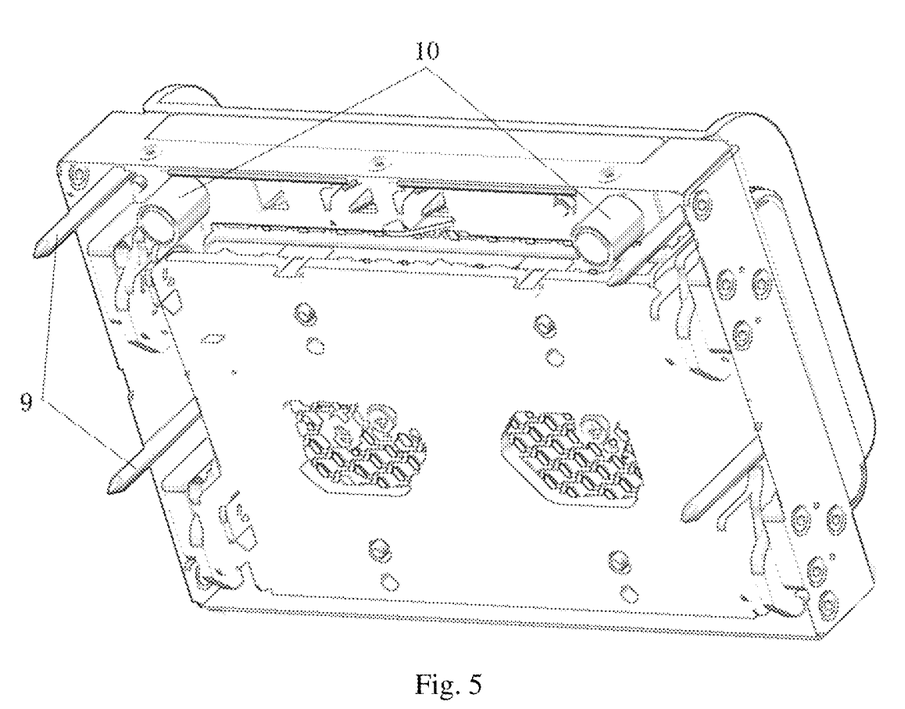
FIG. 5 is a schematic diagram of FIG. 1 at another angle.

As shown in FIG. 5, FIG. 5 is a schematic diagram of FIG. 1 at another angle.

In addition, to facilitate rapid mounting of the jig to the server chassis, in the present disclosure, a plurality of positioning columns 9 are erected on an inner surface of the jig housing 1. In some embodiments, each positioning column 9 is mainly configured to fit each insertion hole disposed in the server chassis, so as to position the jig housing 1 on the server chassis. In general, four to eight positioning columns 9 may be simultaneously disposed, which are located in each corner of the jig housing 1.

Further, to improve the mounting tightness of the jig on the server chassis and prevent accidental separation during the plugging and unplugging operations of the connectors, in the present disclosure, a plurality of elastic columns 10 are further disposed on the inner surface of the jig housing 1. In some embodiments, each elastic column 10 is axially elastic. After the jig housing 1 is mounted to the server chassis, a tail end of each elastic column 10 abuts with an outer wall of the server chassis, such that each elastic column 10 is compressed, elastic potential energy is accumulated in each elastic column 10, and a mounting pre-tightening force between the jig housing 1 and the server chassis is increased by a disposed elastic reaction force.

In addition, to enable the operator to conveniently move the jig housing 1 or remove the jig housing 1 after the plugging and unplugging operations, in the present disclosure, a handle groove 11 is disposed in an outer surface of the jig housing 1. In some embodiments, a plurality of wavy grooves may be disposed in the handle groove 11 to fit finger curvatures of the operator, such that the operator conveniently grabs the handle groove to push and pull the jig housing.

The disclosed embodiments are described above to enable those skilled in the art to implement or use the present disclosure. Various modifications to these embodiments are apparent to those skilled in the art. A general principle defined herein may be implemented in other embodiments without departing from the spirit or scope of the present disclosure. Therefore, the present disclosure will not be limited to these embodiments shown herein but conform to the widest scope consistent with principles and novel characteristics disclosed herein.

The invention claimed is:

1. A pluggable mechanism with a synchronous connecting rod, comprising:
   a turnover connecting rod disposed on a surface of a jig housing in a turnover manner;

the synchronous connecting rod fixedly connected to a rod body of the turnover connecting rod; and a plurality of clamping claws connected to the synchronous connecting rod and configured to clamp corresponding connectors respectively to rotate and apply forces for plugging and unplugging, and wherein a clamping groove configured to clamp a corresponding connector is disposed in an outer edge of each clamping claw, and a rotation center hole configured to cooperate with a centering pin shaft reserved on the jig housing is disposed in a surface of each clamping claw.

2. The pluggable mechanism with the synchronous connecting rod according to claim 1, wherein two turnover connecting rods are simultaneously distributed on the jig housing and located on outer walls of both sides of the jig housing respectively.

3. The pluggable mechanism with the synchronous connecting rod according to claim 2, wherein a connecting beam that facilitates manual force application for simultaneous operation is connected between front ends of the turnover connecting rods at both sides.

4. The pluggable mechanism with the synchronous connecting rod according to claim 3, wherein a tail end of the turnover connecting rod is fixedly connected to a middle or two ends of the synchronous connecting rod.

5. The pluggable mechanism with the synchronous connecting rod according to claim 4, wherein an end portion of each clamping claw is detachably connected with the synchronous connecting rod through a fastener.

6. The pluggable mechanism with the synchronous connecting rod according to claim 5, wherein the synchronous connecting rod is a groove-shaped part, and the end portion of each clamping claw is inserted into a groove of the synchronous connecting rod, and is clamped by groove walls of both sides through the fastener.

7. The pluggable mechanism with the synchronous connecting rod according to claim 1, further comprising an auxiliary connecting rod component connected between the plurality of clamping claws and configured to transmit an acting force between the plurality of clamping claws to improve motion synchrony of the plurality of clamping claws.

8. The pluggable mechanism with the synchronous connecting rod according to claim 7, wherein the auxiliary connecting rod component comprises a first auxiliary connecting rod disposed against the surface of each clamping claw-, and a first rotating shaft in running fit with a first through hole disposed in the surface of each clamping claw is disposed on a surface of the first auxiliary connecting rod.

9. The pluggable mechanism with the synchronous connecting rod according to claim 8, wherein a first cambered hole configured to avoid the centering pin shaft during rotation is disposed in the surface of the first auxiliary connecting rod.

10. The pluggable mechanism with the synchronous connecting rod according to claim 9, wherein the auxiliary connecting rod component further comprises a second auxiliary connecting rod disposed against the surface of the first auxiliary connecting rod, and a second rotating shaft in running fit with a second through hole disposed in the surface of each clamping claw is erected on a surface of the second auxiliary connecting rod; and the first through hole and the second through hole are disposed in both sides of the rotation center hole respectively.

11. The pluggable mechanism with the synchronous connecting rod according to claim 10, wherein a second cambered hole configured to avoid the centering pin shaft during the rotation is disposed in the surface of the second auxiliary connecting rod.

12. The pluggable mechanism with the synchronous connecting rod according to claim 2, wherein the two turnover connecting rods are applied to two connectors at different positions on a single server mainboard.

13. A jig for assisting a pluggable connector, wherein the jig comprises:

a jig housing detachably mounted to a server chassis, and a pluggable mechanism with a synchronous connecting rod disposed on the jig housing, and the pluggable mechanism with the synchronous connecting rod comprises:

a turnover connecting rod disposed on a surface of a jig housing in a turnover manner;

the synchronous connecting rod fixedly connected to a rod body of the turnover connecting rod; and a plurality of clamping claws connected to the synchronous connecting rod and configured to clamp corresponding connectors respectively to rotate and apply forces for plugging and unplugging, and wherein a clamping groove configured to clamp a corresponding connector is disposed in an outer edge of each clamping claw, and a rotation center hole configured to cooperate with a centering pin shaft reserved on the jig housing is disposed in a surface of each clamping claw.

14. The jig for assisting the pluggable connector according to claim 13, wherein a plurality of positioning columns configured to cooperate with respective insertion holes reversed in the server chassis and locate mounting positions of the jig housing are disposed on an inner surface of the jig housing.

15. The jig for assisting the pluggable connector according to claim 14, wherein a plurality of elastic columns configured to abut with a surface of the server chassis and increase a mounting preload between the jig housing and the server chassis are further disposed on the inner surface of the jig housing.

16. The jig for assisting the pluggable connector according to claim 15, wherein a handle groove convenient to grab with a hand to apply a force to push and pull the jig housing is disposed in an outer surface of the jig housing.

17. The jig for assisting the pluggable connector according to claim 14, wherein the plurality of positioning columns are located in each corner of the jig housing.

18. The jig for assisting the pluggable connector according to claim 16, wherein the handle groove comprises a plurality of wavy grooves.

19. The jig for assisting the pluggable connector according to claim 13, wherein two turnover connecting rods are simultaneously distributed on the jig housing and located on outer walls of both sides of the jig housing respectively.

20. The jig for assisting the pluggable connector according to claim 19, wherein a connecting beam that facilitates manual force application for simultaneous operation is connected between front ends of the turnover connecting rods at both sides.

* * * * *